(12) United States Patent
Chang et al.

(10) Patent No.: US 12,502,504 B2
(45) Date of Patent: Dec. 23, 2025

(54) CONSTANT POWER CONTROL DEVICE OF ACTIVE VAPORIZATION SUCTION APPARATUS

(71) Applicants: Yun-Shan Chang, San Jose, CA (US); Da-Wei Lin, Taichung (TW)

(72) Inventors: Yun-Shan Chang, San Jose, CA (US); Da-Wei Lin, Taichung (TW)

( * ) Notice: Subject to any disclaimer, the term of this patent is extended or adjusted under 35 U.S.C. 154(b) by 555 days.

(21) Appl. No.: 18/174,341

(22) Filed: Feb. 24, 2023

(65) Prior Publication Data

US 2024/0216639 A1    Jul. 4, 2024

(30) Foreign Application Priority Data

Dec. 29, 2022 (TW) .................................. 111150668

(51) Int. Cl.
| | | |
|---|---|---|
| *A61M 16/14* | (2006.01) | |
| *A61M 11/04* | (2006.01) | |
| *A61M 16/00* | (2006.01) | |
| *H03K 17/687* | (2006.01) | |
| *H03K 5/156* | (2006.01) | |
| *H03K 5/24* | (2006.01) | |

(52) U.S. Cl.
CPC .......... *A61M 16/14* (2013.01); *A61M 11/042* (2014.02); *A61M 16/026* (2017.08); *H03K 17/687* (2013.01); *H03K 5/1565* (2013.01); *H03K 5/24* (2013.01)

(58) Field of Classification Search
CPC .. A61M 11/042; A61M 16/14; A61M 16/026; H03K 17/687; H03K 15/1565; H03K 5/24

See application file for complete search history.

(56) References Cited

U.S. PATENT DOCUMENTS

| | | | | |
|---|---|---|---|---|
| 2013/0249526 | A1* | 9/2013 | Lee .......................... | G05F 3/02 |
| | | | | 323/313 |
| 2015/0054483 | A1* | 2/2015 | Palatini ................. | H02J 3/1828 |
| | | | | 323/293 |
| 2021/0177064 | A1* | 6/2021 | Fisher ..................... | A24F 40/57 |
| 2023/0148680 | A1* | 5/2023 | Cui ....................... | H02M 1/327 |
| | | | | 219/488 |

* cited by examiner

*Primary Examiner* — Gary L Laxton
(74) *Attorney, Agent, or Firm* — RABIN & BERDO, P.C.

(57) ABSTRACT

A constant power control device of an active vaporization suction apparatus includes a power unit, a first load matching unit, a matching control unit, a second load matching unit, and a constant current generation unit. To replace a medication box along with a liquefied medication within, a new medication box is mounted on the constant power control device, and the first load matching unit is electrically connected to a load unit of the replaced medication box. The first load matching unit determines a load value of the load unit. The second load matching unit and the constant current generation unit generate a constant current signal according to the load value, and transmit the constant current signal to the load unit, thus allowing the load unit to vaporize the liquefied medication with a constant power. The present invention prevents the constant power from changing due to medication box replacements.

11 Claims, 8 Drawing Sheets

CONSTANT POWER CONTROL DEVICE OF ACTIVE VAPORIZATION SUCTION APPARATUS

CROSS-REFERENCE TO RELATED APPLICATION(S)

This application claims the priority benefit of TW application serial No. 111150668 filed on Dec. 29, 2022, the entirety of which is hereby incorporated by reference herein and made a part of the specification.

BACKGROUND OF THE INVENTION

1. Field of the Invention

The present invention relates to a constant power control device, more particularly a constant power control device of an active vaporization suction apparatus.

2. Description of the Related Art

In recent years, infectious disease such as pandemic illness, seasonal flu, bird flu, or the newly discovered coronavirus (COVID-19) has been plaguing daily human lives. Despite having various equipment and means to fight against the infectious disease, little of the equipment is cost effective and easy to work with. For instance, an oral medication can be more conveniently administered to a patient, but the oral medication takes longer time to have an effect on the patient. A drug injection takes an effect on the patient faster, except that only limited drugs are allowed for injections. A suction medication is an alternative from the oral medication and the drug injection. The suction medication vaporizes a drug into fine molecules that can be absorbed by alveoli in the lungs and capillaries in the upper and lower respiratory tracts, and thus allows the vaporized drug to be absorbed efficiently. The suction medication is also suitable for providing medication to patients with chronic conditions.

The suction medication is generated by equipment that vaporizes the drug into vapors or a mist of droplets, and the equipment blows the vapors or the mist of droplets into a nose or a mouth of the patient with a ventilation device. For example, the equipment may be a fan, and may allow the vapors or the mist of droplets to be breathed in and absorbed by the patient.

However, currently the equipment directly blows the vaporized drug into the respiratory tracts of the patient with the ventilation device, and thus the current equipment tends to stimulate the patient in an uncomfortable way. Furthermore, the common equipment often vaporizes the drug into big droplets instead of fine droplets. These big droplets cannot be efficiently absorbed by the patient, and thus most of these big droplets of the vaporized drug are simply wasted into the air without adequate use.

More particularly, in order to vaporize the drug from a solid or liquid state into vapors, the drug should be heated or vibrated for decoupling liquefied molecules of the drug into vapors. This process is conventionally done by providing electricity to a resistor for Joule heating the drug. When all of the drugs are vaporized, the resistor used for Joule heating is often replaced along with a cartridge of the drug. However, the newly replaced resistor for Joule heating often has a different resistance value than the previous one. Furthermore, despite having a different resistance value, the newly replaced resistor is still supplied with the same amount of electricity, i.e. the same amount of current or the same amount of voltage, for vaporizing the drug. Under a same current or a same voltage, when a resistance of a circuit is changed, a power produced for the circuit naturally also changes. Therefore, when the equipment produces fluctuating power for vaporizing the drug, due to changes in resistance from the replacement of the resistor, the drug is vaporized with varying amounts of vapors. As such, the drug may be under-vaporized or over-vaporized, affecting a quality of the vaporization of the drug.

The current equipment, therefore, requires further improvement for supplying electricity for vaporizing the drugs in order to ensure better vaporization quality for the drug.

SUMMARY OF THE INVENTION

To overcome the aforementioned problem, the present invention provides a constant power control device of an active vaporization suction apparatus. By having constant power control, the present invention supplies stable electric power for vaporizing a drug, preventing an under-vaporization or an over-vaporization of the drug.

The constant power control device of the active vaporization suction apparatus of the present invention includes a power unit, a first load matching unit, a matching control unit, a second load matching unit, and a constant current generation unit.

The power unit includes a power port, and the power port outputs a power signal. The first load matching unit includes a first power input port, a load connection port, a matching signal output port, and a first control signal input port. The first power input port is electrically connected to the power port for receiving the power signal. The matching control unit includes a matching signal input port and a control signal output port. The matching signal input port is electrically connected to the matching signal output port of the first load matching unit, and the control signal output port is electrically connected to the first control signal input port of the first load matching unit. The second load matching unit includes a second power input port, a constant current control signal output port, and a second control signal input port. The second power input port is electrically connected to the power port for receiving the power signal. The second control signal input port is electrically connected to the control signal output port of the matching control unit. The constant current generation unit includes a third power input port, a constant current control signal input port, and a constant current output port. The third power input port is electrically connected to the power port for receiving the power signal. The constant current control signal input port is electrically connected to the constant current control signal output port of the second load matching unit. The constant current output port is adapted to be electrically connected to a load unit of the medication box.

When the load connection port of the first load matching unit is electrically connected to the load unit of the medication box, the first load matching unit generates a load matching signal, and outputs the load matching signal through the load connection port to the load unit of the medication box. The matching signal output port of the first load matching unit also outputs a matching result signal to the matching control unit. The matching control unit receives the matching result signal and generates a control signal according to the matching result signal. The matching control unit then outputs the control signal through the control signal output port to the first load matching unit and the second load matching unit. As a result, the matching control unit controls a first load value of the first load matching unit to match a load value of the load unit of the medication box, and also controls a second load value of the second load matching unit to match the load value of the load unit of the medication box.

When the second load matching unit receives the control signal outputted from the matching control unit, the second load matching unit generates a constant current control signal according to the control signal, and the second load matching unit outputs the constant current control signal through the constant current control signal output port to the constant current generation unit.

When the constant current generation unit receives the constant current control signal, the constant current generation unit generates a constant current signal according to the constant current control signal. The constant current generation unit then outputs the constant current signal through the constant current output port to the load unit of the medication box, and thus allows the load unit of the medication box to generate a constant power.

To be more concise, when the load connection port of the first load matching unit is electrically connected to the load unit of the medication box, the first load matching unit outputs the load matching signal to the load unit of the medication box and also outputs the matching result signal to the matching control unit. This allows the matching control unit to generate the control signal to the first load matching unit for controlling the first load matching unit, and thus allows the first load value of the first load matching unit to match the load value of the load unit of the medication box. As such, the present invention is able to confirm the load value of the load unit of the medication box. This allows the second load matching unit and the constant current generation unit to further generate the constant current signal to the load unit of the medication box, and thus allows the load unit of the medication box to generate the constant power.

Overall, even if a resistor for Joule heating within the medication box is replaced with a new resistor with a different resistance value, the present invention is still able to confirm the resistance value of the newly replaced resistor, and thus outputs the constant current signal to the resistor according to the confirmed resistance value of the newly replaced resistor. As the newly replaced resistor receives the constant current signal, the newly replaced resistor generates the constant power for vaporizing the drug in the medication box, and as a result, the load unit of the medication box would be able to stably vaporize the drug without under-vaporizing or over-vaporizing the drug.

DETAILED DESCRIPTION OF THE INVENTION

Figure 1:
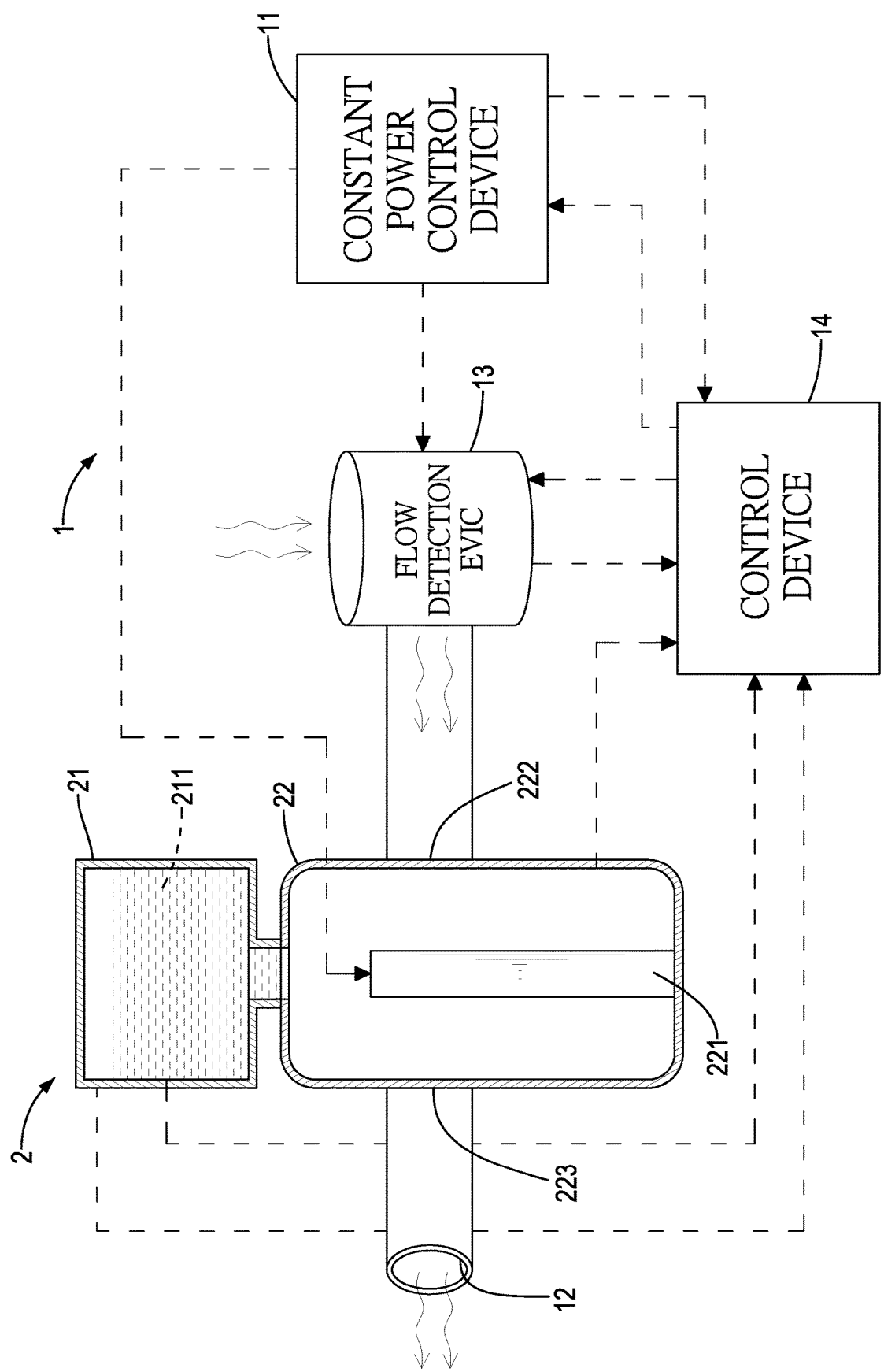
FIG. 1 is a perspective view of an active vaporization suction apparatus.
Figure 2:
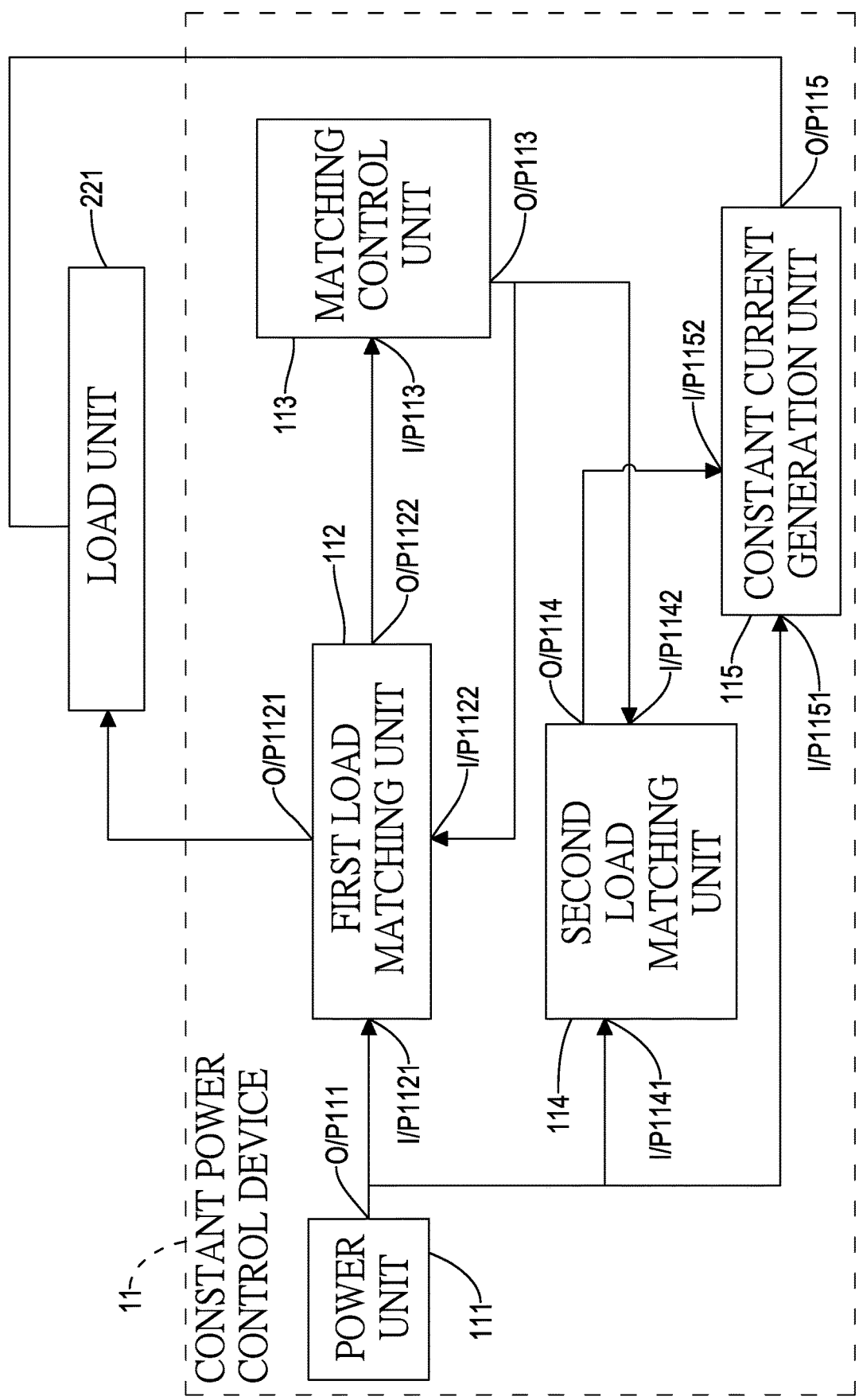
FIG. 2 is a block perspective view of a constant power control device of the active vaporization suction apparatus of the present invention.

With reference to FIGS. 1 and 2, the present invention provides a constant power control device 11 of an active vaporization suction apparatus 1, and the constant power control device 11 is adapted to the active vaporization suction apparatus 1.

The active vaporization suction apparatus 1 is adapted to have a medication box 2 detachably placed inside the active vaporization suction apparatus 1. The medication box 2 includes a drug cartridge 21 and a vaporization chamber 22. The drug cartridge 21 contains a liquefied medication 211, and the vaporization chamber 22 is in fluid communication with the drug cartridge 21. The vaporization chamber 22 includes a load unit 221 of the medication box 2, an air inlet 222, and an air outlet 223. The load unit 221 of the medication box 2 is mounted inside of the vaporization chamber 22, and the load unit 221 is, for example, a resistor adapted for Joule heating the liquefied medication 211.

The active vaporization suction apparatus 1 includes the constant power control device 11, a suction device 12, a flow detection device 13, and a control device 14. The suction device 12 is in fluid communication with the air outlet 223 of the vaporization chamber 22, and the flow detection device 13 is in communication with the air inlet 222 of the vaporization chamber 22. The flow detection device 13 detects whether the suction device 12 is experiencing a suction flow, and when the suction device 12 is experiencing the suction flow, the flow detection device 13 outputs a start signal. The control device 14 is electrically connected to the flow detection device 13. The constant power control device 11 is electrically connected to the control device 14 and the load unit 221 inside of the vaporization chamber 22.

When the control device 14 receives the start signal, the control device 14 accordingly generates a start current signal and outputs the start current signal to the constant power control device 11. The constant power control device 11 generates a constant current signal according to the start current signal, and the constant power control device 11 outputs the constant current signal to the load unit 221 inside of the vaporization chamber 22. This allows the load unit 221 to vaporize the liquefied medication in the vaporization chamber 22, and thus allows the liquefied medication to vaporize into a vaporized medication, i.e. turning the liquefied medication from a liquid state into a vapor state. As such, the vaporized medication contains molecule clusters in nanometer scale, ranging from a few nanometers to a few hundred nanometers.

The constant power control device 11 includes a power unit 111, a first load matching unit 112, a matching control unit 113, a second load matching unit 114, and a constant current generation unit 115.

The power unit 111 includes a power port O/P111, and the power port O/P111 outputs a power signal. The first load matching unit 112 includes a first power input port I/P1121, a load connection port O/P1121, a matching signal output port O/P1122, and a first control signal input port I/P1122. The first power input port I/P1121 is electrically connected to the power port O/P111 for receiving the power signal. The matching control unit 113 includes a matching signal input port I/P113 and a control signal output port O/P113. The matching signal input port I/P113 is electrically connected to the matching signal output port O/P1122 of the first load matching unit 112, and the control signal output port O/P113 is electrically connected to the first control signal input port I/P1122 of the first load matching unit 112. The second load matching unit 114 includes a second power input port I/P1141, a constant current control signal output port O/P114, and a second control signal input port I/P1142. The second power input port I/P1141 is electrically connected to the power port O/P111 for receiving the power signal. The second control signal input port I/P1142 is electrically connected to the control signal output port O/P113 of the matching control unit 113. The constant current generation unit 115 includes a third power input port I/P1151, a constant current control signal input port I/P1152, and a constant current output port O/P115. The third power input port I/P1151 is electrically connected to the power port O/P111 for receiving the power signal. The constant current control signal input port I/P1152 is electrically connected to the constant current control signal output port O/P114 of the second load matching unit 114. The constant current output port O/P115 is adapted to be electrically connected to the load unit 221 of the medication box 2.

When the load connection port O/P1121 of the first load matching unit 112 is electrically connected to the load unit 221 of the medication box 2, the first load matching unit 112 generates a load matching signal, and outputs the load matching signal through the load connection port O/P1121 to the load unit 221 of the medication box 2. The matching signal output port O/P1122 of the first load matching unit 112 also outputs a matching result signal to the matching control unit 113. The matching control unit 113 receives the matching result signal and generates a control signal according to the matching result signal. The matching control unit 113 then outputs the control signal through the control signal output port O/P113 to the first load matching unit 112 and the second load matching unit 114. As a result, the matching control unit 113 controls a first load value of the first load matching unit 112 to match a load value of the load unit 221 of the medication box 2, and also controls a second load value of the second load matching unit 114 to match the load value of the load unit 221 of the medication box 2.

When the second load matching unit 114 receives the control signal outputted from the matching control unit 113, the second load matching unit 114 generates a constant current control signal according to the control signal, and the second load matching unit 114 outputs the constant current control signal through the constant current control signal output port O/P114 to the constant current generation unit 115.

When the constant current generation unit 115 receives the constant current control signal, the constant current generation unit 115 generates a constant current signal according to the constant current control signal. The constant current generation unit 115 then outputs the constant current signal through the constant current output port O/P115 to the load unit 221 of the medication box 2, and thus allows the load unit 221 of the medication box 2 to generate a constant power.

Further, when the first load value of the first load matching unit 112 matches the load value of the load unit 221, the first load matching unit 112 stops outputting the load matching signal.

As a result, the load unit 221 of the medication box 2 would be able to stably vaporize the drug without under-vaporizing or over-vaporizing the liquefied medication.

For example, when a user uses the active vaporization suction apparatus 1, the users puts the suction device 12 in mouth and breathes in, and the flow detection device 13 detects whether the user is actively breathing in air. When the user is breathing in, the control device 14 is able to detect that the user is breathing in through the flow detection device 13, and thus the control device 14 controls the constant power control device 11 to start providing electricity to the load unit 221. As the load unit 221 receives electricity, the load unit 221 starts to heat up and to vaporize the liquefied medication in the vaporization chamber 22, and thus allows the user to breathe in the vaporized medication.

As such, the active vaporization suction apparatus 1 only dispenses the vaporized medication to the user when the user is breathing in. This allows the user to breathe in the vaporized medication more comfortably. As most of the vaporized medication is breathed in willingly by the user, this also prevents a situation wherein some of the vaporized medication is rejected by the user and wasted into air.

Furthermore, as the constant power control device 11 of the present invention provides the constant power to vaporize the liquefied medication, the liquefied medication would be able to vaporize stably in the vaporization chamber 22, and thus allow the user to comfortably and effectively breathe in the vaporized medication.

When the liquefied medication is used up and the medication box 2 needs to be replaced to supplement the liquefied medication 221, the medication box 2 is newly replaced and mounted on the constant power control device 11. This replacement allows the first load matching unit 112 to be electrically connected to the newly replaced load unit 221, and as such, the first load matching unit 112 generates the load matching signal to the load unit 221 and generates the matching result signal to the matching control unit 113. This way, the first load matching unit 112 is able to determine the load value of the load unit 221 of the medication box 2. The constant power control device 11 further generates the constant current signal through the second load matching unit 114 and the constant current generation unit 115 to the load unit 221 according to the load value of the load unit 221. As such, the constant power control device 11 is able to adjust an amount of electric current provided to the load unit 221, and allows the newly replaced load unit 221 to heat up and vaporize the liquefied medication with the same power as the previous load unit 221. This way, the present invention ensures the liquefied medication is vaporized into the vaporized medication under a same condition, and prevents vaporization quality fluctuations caused by the newly replaced load unit 221 having a different resistance value than the previous load unit 221.

Figure 3:
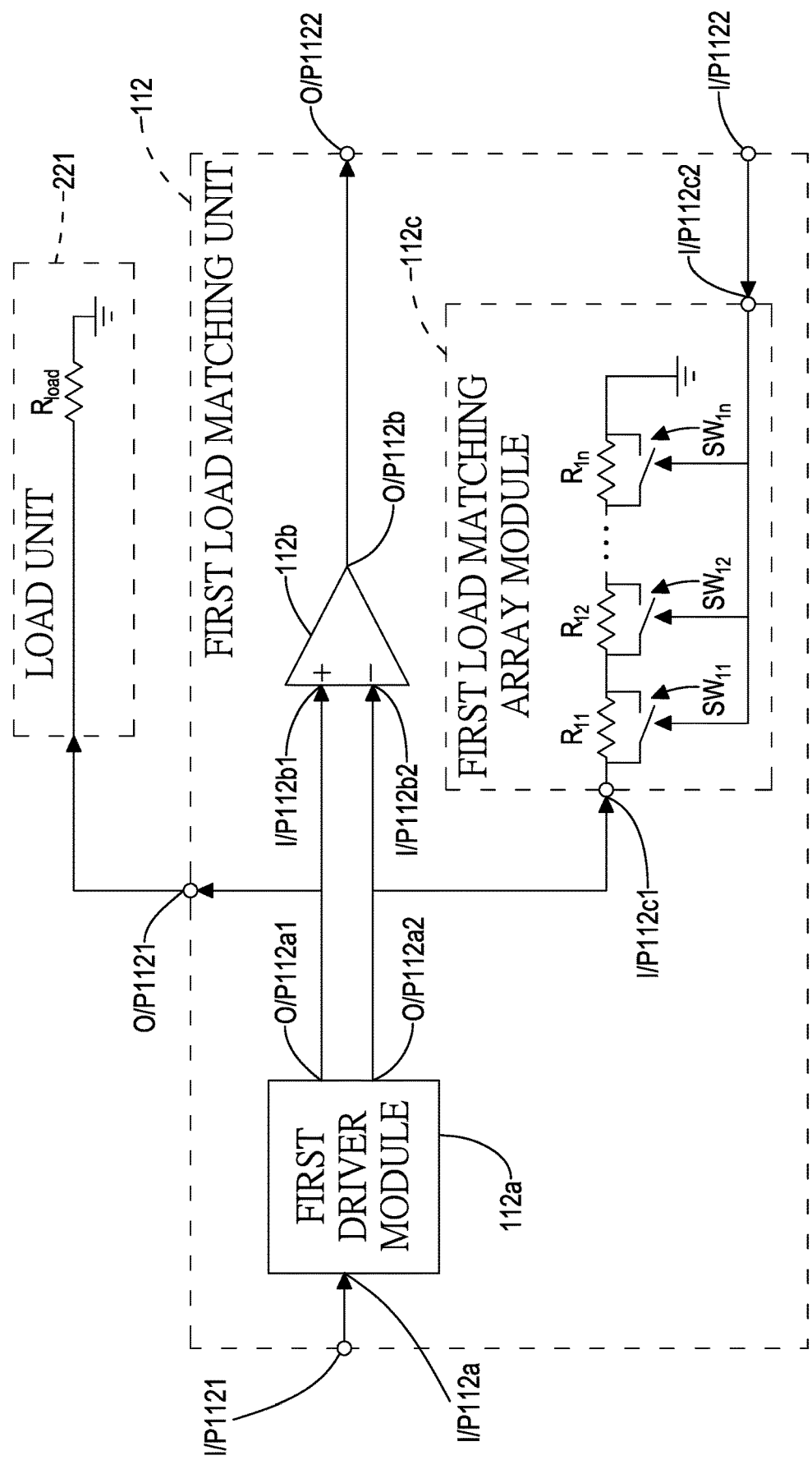
FIG. 3 is a circuit block perspective view of a first load matching unit of the constant power control device of the present invention.

With reference to FIG. 3, the first load matching unit 112 includes a first driver module 112a, a first comparator module 112b, and a first load matching array module 112c. The first driver module 112a includes a first driver power input port I/P112a, a first matching current output port O/P112a1, and a second matching current output port O/P112a2. The first driver power input port I/P112a is the first power input port I/P1121, and the first matching current output port O/P112a1 is the load connection port O/P1121. The first driver power input port I/P112a receives the power signal, and the first driver module 112a generates a first matching current and a second matching current according to the power signal. The first driver module 112a then outputs the first matching current from the first matching current output port O/P112al and the second matching current from the second matching current output port O/P112a2. A first current value of the first matching current equals a second current value of the second matching current.

The first comparator module 112b has a first comparator positive input side I/P112b1, a first comparator negative input side I/P112b2, and a first comparator output side O/P112b. The first comparator positive input side I/P112b1 is electrically connected to the first matching current output port O/P112a1, and the first comparator negative input side I/P112b2 is electrically connected to the second matching current output port O/P112a2. The first comparator output side O/P112b is the matching signal output port O/P1122.

The first load matching array module 112c includes a comparator current input port I/P112c1 and a first matching control signal input port I/P112c2. The comparator current input port I/P112c1 is electrically connected to the second matching current output port O/P112a2. The first matching control signal input port I/P112c2 is the first control signal input port I/P1122.

Furthermore, when a voltage of the first comparator output side O/P112b of the first comparator module 112b changes from a low level voltage to a high level voltage or changes from the high level voltage to the low level voltage, the first load value of the first load matching unit 112 matches the load value of the load unit 221.

Since the first load matching array module 112c of the first load matching unit 112 and the load unit 221 are provided with a same amount of electric current, when the first load value of the first load matching unit 112 matches the load value of the load unit 221, a voltage of the first comparator positive input side I/P112b1 equals to a voltage of the first comparator negative input side I/P112b2. This triggers the voltage of the first comparator output side O/P112b to change either from the high level voltage to the low level voltage or from the low level voltage to the high level voltage. Therefore, when the voltage of the first comparator output side O/P112b changes, the first load value of the first load matching unit 112 will match the load value of the load unit 221.

The first load matching array module 112c of the first load matching unit 112 further includes multiple first load matching resistors $R_{11}$-$R_{1n}$ and multiple first switches $SW_{11}$-$SW_{1n}$. The first load matching resistors $R_{11}$-$R_{1n}$ are connected in series, and each of the first load matching resistors $R_{11}$-$R_{1n}$ has a different resistance value.

The first switches $SW_{11}$-$SW_{1n}$ are respectively one-to-one connected in parallel with the first load matching resistors $R_{11}$-$R_{1n}$. The first switches $SW_{11}$-$SW_{1n}$ each respectively have a control side, and the control sides of the first switches $SW_{11}$-$SW_{1n}$ are the first matching control signal input port I/P112c2. The control sides of the first switches $SW_{11}$-$SW_{1n}$ receive the control signal, and the first switches $SW_{11}$-$SW_{1n}$ are respectively controlled for switching on and off according to the control signal.

When one or more of the first switches $SW_{11}$-$SW_{1n}$ are switched on for conducting electricity, the first load matching resistors $R_{11}$-$R_{1n}$ connected in parallel with the first switches $SW_{11}$-$SW_{1n}$ that are switched on and conducting electricity are shorted by the first switches $SW_{11}$-$SW_{1n}$ that are switched on and conducting electricity.

In an embodiment of the present invention, the first load matching resistors $R_{11}$-$R_{1n}$ each respectively have a resistance value of $2^0 r$–$2^{n-1} r$, wherein r denotes a basic load value, for example, r equals 0.1 Ohm ($\Omega$).

Figure 4A:
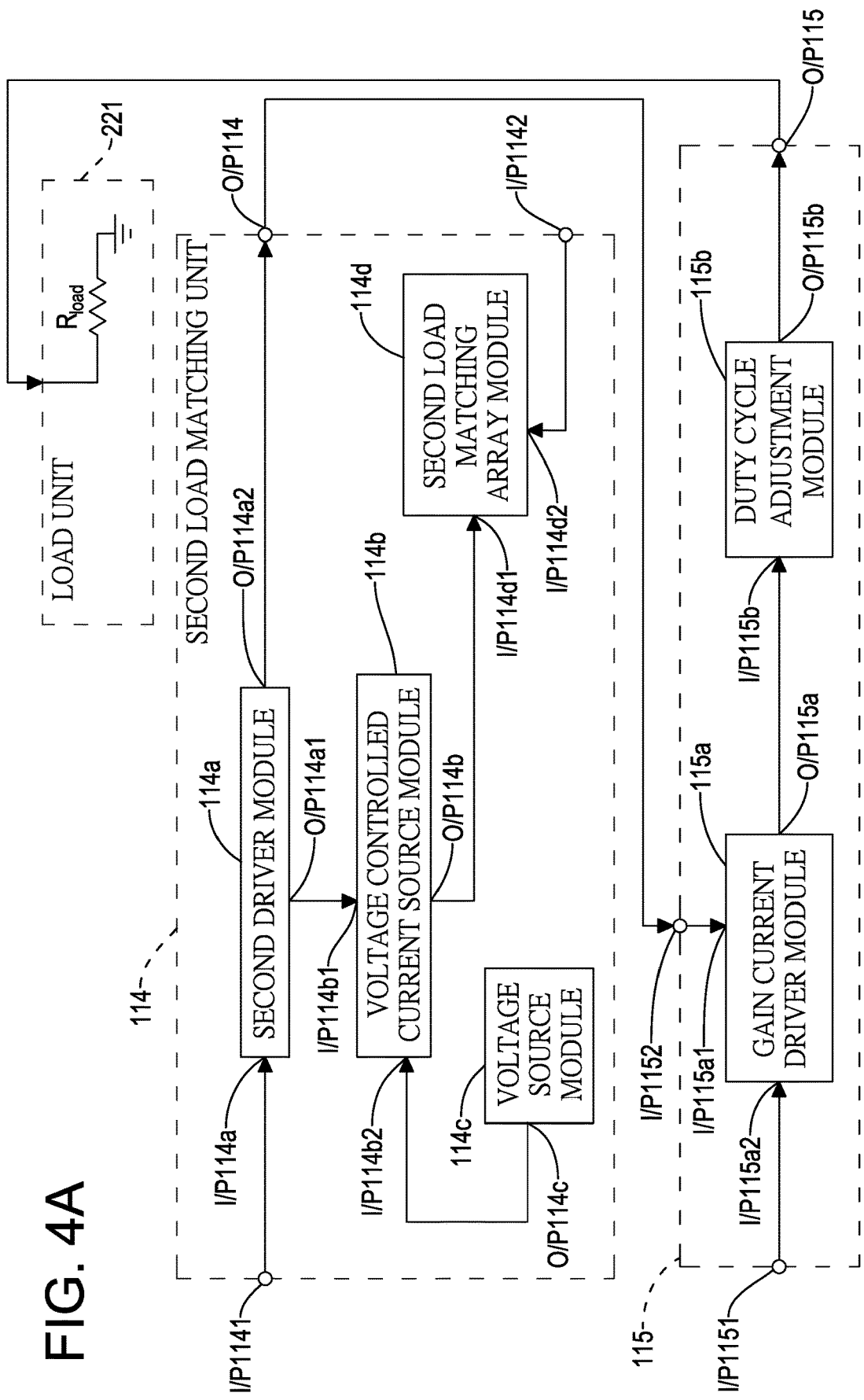
FIG. 4A is a block perspective view of a second load matching unit and a constant current generation unit in a first embodiment of the constant power control device of the present invention.

With reference to FIG. 4A, the second load matching unit 114 includes a second driver module 114a, a voltage controlled current source module 114b, a voltage source module 114c, and a second load matching array module 114d. The second driver module 114a includes a second driver power input port I/P114a, a driver power output port O/P114a1, and a gain control signal output port O/P114a2. The second driver power input port I/P114a is the second power input port I/P1141 for receiving the power signal. The second driver module 114a generates a driver power according to the power signal, and outputs the driver power through the driver power output port O/P114a1. The gain control signal output port O/P114a2 is the constant current control signal output port O/P114.

The voltage controlled current source module 114b includes a driver power input port I/P114b1, a voltage control signal input port I/P114b2, and a voltage controlled current output port O/P114b. The driver power input port I/P114b1 is electrically connected to the driver power output port O/P114al of the second driver module 114a for receiving the driver power.

The voltage source module 114c includes a voltage control signal output port O/P114c. The voltage control signal output port O/P114c is electrically connected to the voltage control signal input port I/P114b2 of the voltage controlled current source module 114b. The voltage source module 114c outputs a constant voltage signal through the voltage control signal output port O/P114c to the voltage control signal input port I/P114b2.

In the current embodiment, the voltage source module 114c is a bandgap reference circuit. In other words, the constant voltage signal generated by the voltage source module 114c stays constant regardless of changes in semiconductor manufacturing processes, temperatures, or power voltages.

The second load matching array module 114d includes a voltage controlled current input port I/P114d1 and a second matching control signal input port I/P114d2. The voltage controlled current input port I/P114d1 is electrically connected to the voltage controlled current output port O/P114b, and the second matching control signal input port I/P114d2 is electrically connected to the second control signal input port I/P1142.

The voltage controlled current source module 114b controls a current value of the driver power according to the constant voltage signal and a load value of the second load matching array module 114d. The second driver module 114a generates the constant current control signal according to the current value of the driver power.

In a first embodiment, the constant current generation unit 115 includes a gain current driver module 115a and a duty cycle adjustment module 115b. The gain current driver module 115a includes a gain control signal input port I/P115a1, a third driver power input port I/P115a2, and a gain current output port O/P115a. The third driver power input port I/P115a2 is the third power input port I/P1151 for receiving the power signal. The gain control signal input port I/P115al is the constant current control signal input port I/P1152 for receiving the constant current control signal. The gain current driver module 115a generates a gain current according to the constant current control signal, and the gain current driver module 115a outputs the gain current through the gain current output port O/P115a.

The duty cycle adjustment module 115b includes an adjustment input port I/P115b and an adjustment output port O/P115b. The adjustment input port I/P115b is electrically connected to the gain current output port O/P115a for receiving the gain current. The adjustment output port O/P115b is the constant current output port O/P115. The duty cycle adjustment module 115b adjusts a duty cycle of the gain current for generating the constant current signal, and the duty cycle adjustment module 115b outputs the constant current signal through the adjustment output port O/P115b.

Figure 4B:
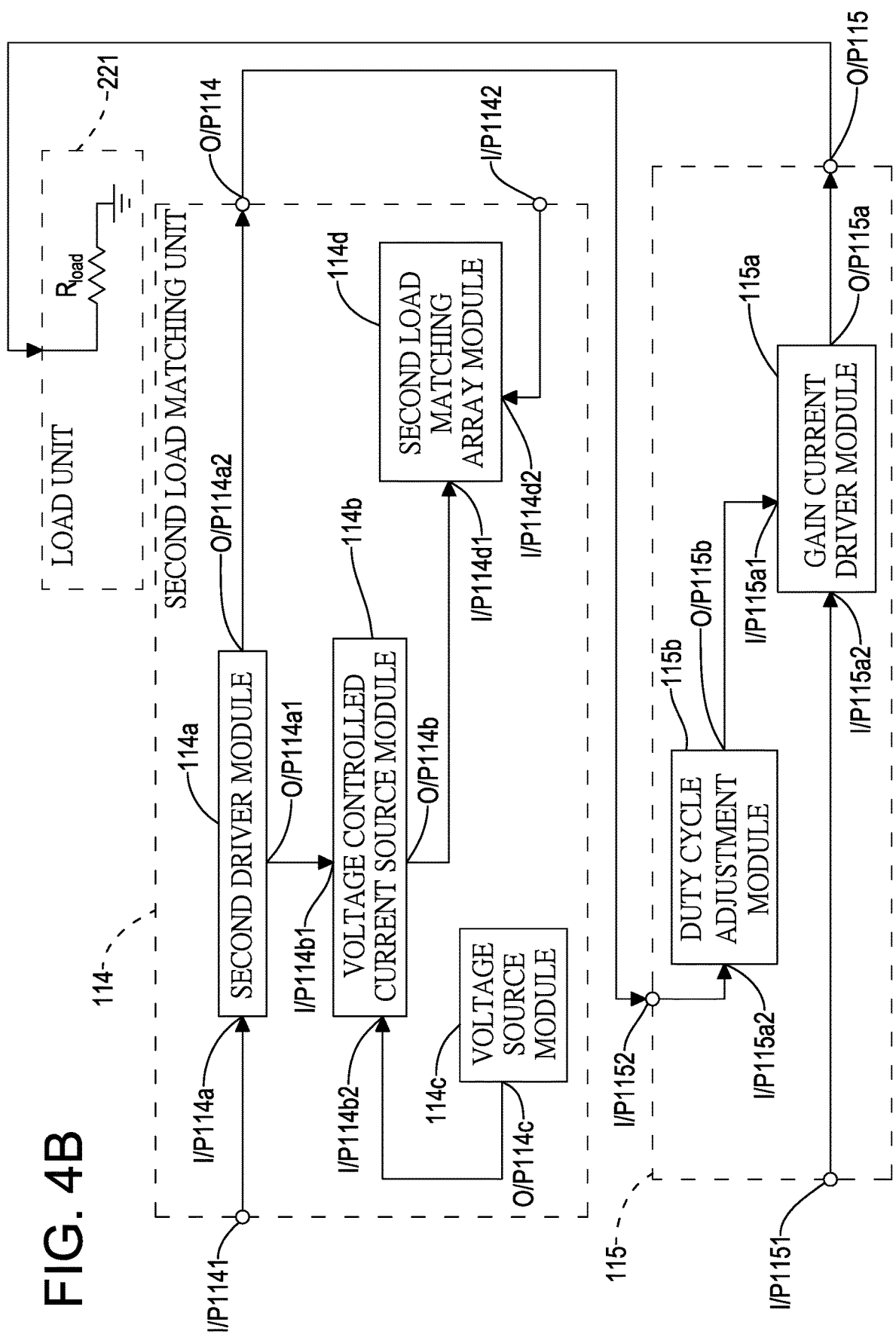
FIG. 4B is a block perspective view of the second load matching unit and the constant current generation unit in a second embodiment of the constant power control device of the present invention.

With reference to FIG. 4B, in a second embodiment, the constant current generation unit 115 includes a gain current driver module 115a and a duty cycle adjustment module 115b. The gain current driver module 115a includes a gain control signal input port I/P115a1, a third driver power input port I/P115a2, and a gain current output port O/P115a. The third driver power input port I/P115a2 is the third power input port I/P1151 for receiving the power signal. The gain current output port O/P115a is the constant current output port O/P115. The gain current driver module 115a generates the constant current signal according to the constant current control signal, and the gain current driver module 115a outputs the constant current signal through the gain current output port O/P115a.

The duty cycle adjustment module 115b includes an adjustment input port I/P115b and an adjustment output port O/P115b. The adjustment input port I/P115b is the constant current control signal input port I/P1152 for receiving the constant current control signal. The adjustment output port O/P115b is electrically connected to the gain control signal input port I/P115a1 of the gain current driver module 115a. The duty cycle adjustment module 115b adjusts a duty cycle of the constant current control signal, and thus the duty cycle adjustment module 115b is able to adjust an electric current duty cycle of the constant current signal through the gain current driver module 115a.

Figure 5:
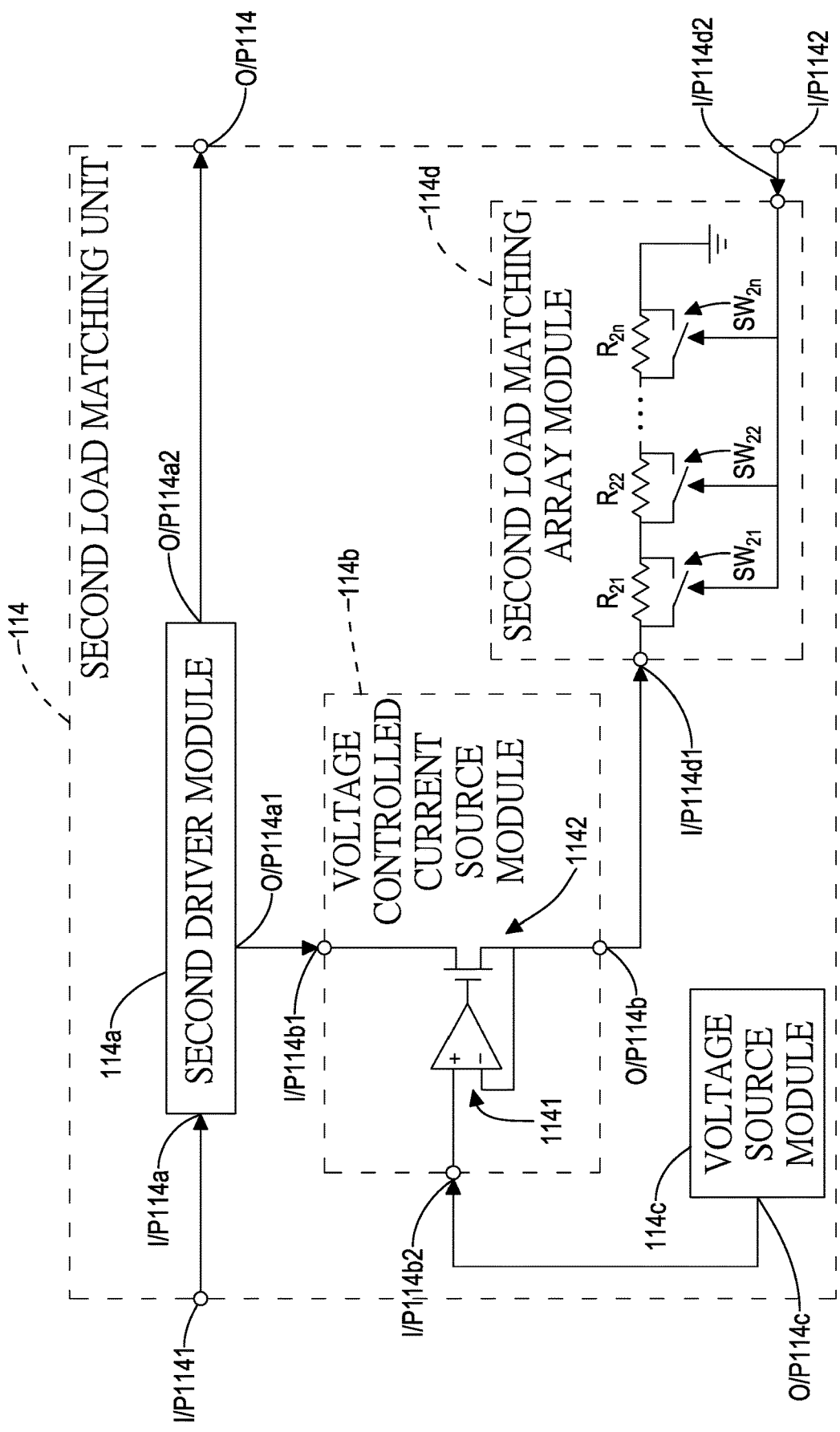
FIG. 5 is a circuit block perspective view of the second load matching unit of the constant power control device of the present invention.

With reference to FIG. 5, the voltage controlled current source module 114b includes a second comparator module 1141 and a Metal-Oxide-Semiconductor Field-Effect Transistor (MOSFET) 1142. The second comparator module 1141 has a second comparator positive input side, a second comparator negative input side, and a second comparator output side. The second comparator positive input side is the voltage control signal input port I/P114b2 for receiving the constant voltage signal. The second comparator negative input side is the voltage controlled current output port O/P114b.

The MOSFET 1142 has a drain, a source, and a gate. The gate is electrically connected to the second comparator output side of the second comparator module 1141. One of the drain and the source is electrically connected to the second comparator negative input side of the second comparator module 1141, and the other one of the drain and the source is the driver power input port I/P114b1.

Furthermore, in another embodiment, the MOSFET 1142 can also be replaced with a bipolar transistor (BJT). The BJT has a collector, an emitter, and a base. The base is electrically connected to the second comparator output side of the second comparator module 1141. One of the collector and the emitter is electrically connected to the second comparator negative input side of the second comparator module 1141, and the other one of the collector and the emitter is the driver power input port I/P114b1.

The second load matching array module 114d of the second load matching unit 114 includes multiple second load matching resistors $R_{21}$-$R_{2n}$ and multiple second switches $SW_{21}$-$SW_{2n}$. The second load matching resistors $R_{21}$-$R_{2n}$ are connected in series, and each of the second load matching resistors $R_{21}$-$R_{2n}$ has a different resistance value.

The second switches $SW_{21}$-$SW_{2n}$ are respectively one-to-one connected in parallel with the second load matching resistors $R_{21}$-$R_{2n}$. The second switches $SW_{21}$-$SW_{2n}$ each respectively have a control side, and the control sides of the second switches $SW_{21}$-$SW_{2n}$ are the second matching control signal input port I/P114d2. The control sides of the second switches $SW_{21}$-$SW_{2n}$ receive the control signal, and the second switches $SW_{21}$-$SW_{2n}$ are respectively controlled for switching on and off according to the control signal.

When one or more of the second switches $SW_{21}$-$SW_{2n}$ are switched on for conducting electricity, the second load matching resistors $R_{21}$-$R_{2n}$ connected in parallel with the second switches $SW_{21}$-$SW_{2n}$ that are switched on and conducting electricity are shorted by the second switches $SW_{21}$-$SW_{2n}$ that are switched on and conducting electricity.

In the current embodiment, the second load matching resistors $R_{21}$-$R_{2n}$ each respectively have a resistance value of $2^0 Nr$-$2^{n-1} Nr$, wherein r denotes a basic load value, and N denotes a gain multiplication that is an integer greater than one, for example, r equals $0.8\Omega$, and N is an integer from 1,000 to 10,000. As such, the resistance value for the second load matching unit 114 is N times greater than the resistance value for the first load matching unit 112.

For example, the control signal generated by the matching control unit 113 is used to switch on or switch off the first switches $SW_{11}$-$SW_{1n}$ and the second switches $SW_{21}$-$SW_{2n}$, in other words, the control signal is used to adjust the first load value of the first load matching unit 112 and the second load value of the second load matching unit 114. In the current embodiment, the control signal is a binary signal of n bits, for example, the control signal can be represented as [0, 1, . . . , 0] wherein 0 represents switching off and 1 represents switching on. In other words, the control signal represented as [0, 1, . . . , 0] means that the second one of the first switches $SW_{11}$-$SW_{1n}$ or the second switches $SW_{21}$-$SW_{2n}$ is switched on, and therefore, one of the first load matching resistors $R_{11}$-$R_{1n}$ connected in parallel with the second one of the first switches $SW_{11}$-$SW_{1n}$ or one of the second load matching resistors $R_{21}$-$R_{2n}$ connected in parallel with the second one of the second switches $SW_{21}$-$SW_{2n}$ is shorted. This way, either the first load value of the first load matching unit 112 is represented as $R_{11}+R_{13}+R_{14} \ldots +R_{1n}$, or the second load value of the second load matching unit 114 is represented as $R_{21}+R_{23}+R_{24} \ldots +R_{2n}$.

Furthermore, the second load value of the second load matching unit 114 is calculated as:

$$R_{LN} = \sqrt{R_m/p} \times V_{BG} \times N$$

wherein $R_{LN}$ denotes the second load value of the second load matching unit 114, $R_m$ denotes the load value of the load unit 221 of the medication box 2, p is constant ranging from 6 to 300,000, $V_{BG}$ denotes a voltage value of the constant voltage signal outputted by the voltage source module 114c, and N denotes the gain multiplication.

Furthermore, since the second load value of the second load matching unit 114 is N times greater than the first load value of the first load matching unit 112, under same voltage conditions, the current value is set by the second load matching unit 114 as 1/N times of the constant current signal. Then as the constant current generation unit 115 amplifies the current N times, the constant current generation unit 115 is able to generate the constant current signal to provide electricity to the load unit 221 of the medication box 2, and thus allows the load unit 221 to generate the constant power. As such, the second load matching unit 114 only requires electric current N times less than the constant current signal to be driven, and the present invention thus is able to partly decrease power expenditure and save energy.

The voltage controlled current source module 114*b* is an operational amplified (op-amp) with large closed-circuit gains. With regard to the constant voltage signal of the voltage source module 114*c* and the second load value of the second load matching unit 114 being N times greater, the voltage controlled current source module 114*b* is able to stably generate 1/N times the constant current signal without being affected by ambient environmental changes or manufacturing changes.

Furthermore, the 1/N times constant current signal generated by the voltage controlled current source module 114*b* enters a current mirror formed by the second driver module 114*a* and the gain current driver module 115*a*. The current mirror uses the 1/N times constant current signal to control the constant current generation unit 115 producing the constant current signal with a constant current value, and thus allows the load unit 221 of the medication box 2 to produce stable power.

For example, a formula is expressed as:

$$P = I_L^2 \times R_{load}$$

wherein P denotes a power generated by the load unit 221 of the medication box 2, $I_L$ denotes a current value of a current passing through the load unit 221, and $R_{load}$ denotes the load value of the load unit 221.

In the current embodiment, the constant current signal is a bias voltage of a current driver. The constant current signal is, for example, a bias voltage of a P-type semiconductor.

Figure 6A:
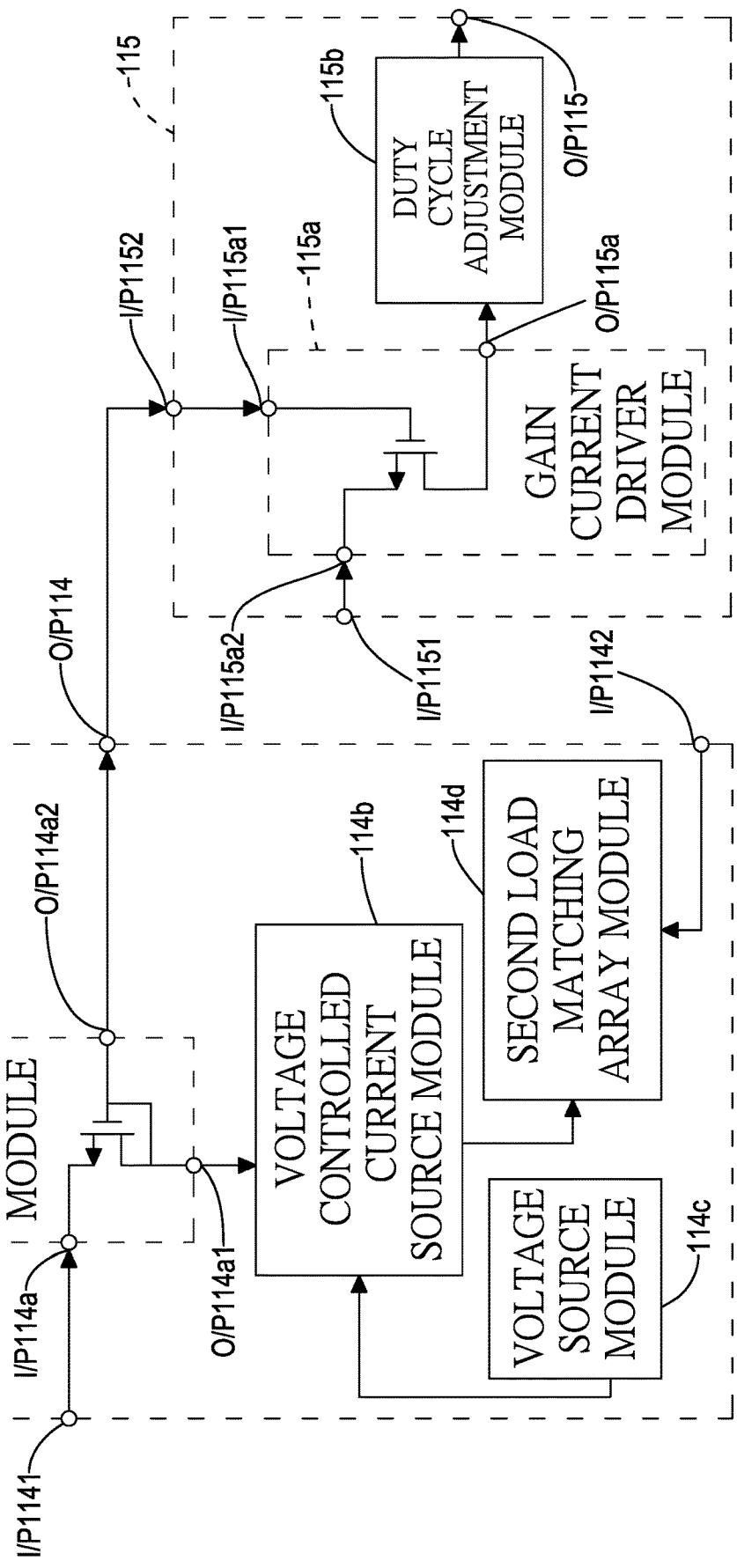
FIG. 6A is a circuit block perspective view of the second load matching unit and the constant current generation unit in the first embodiment of the constant power control device of the present invention.
Figure 6B:
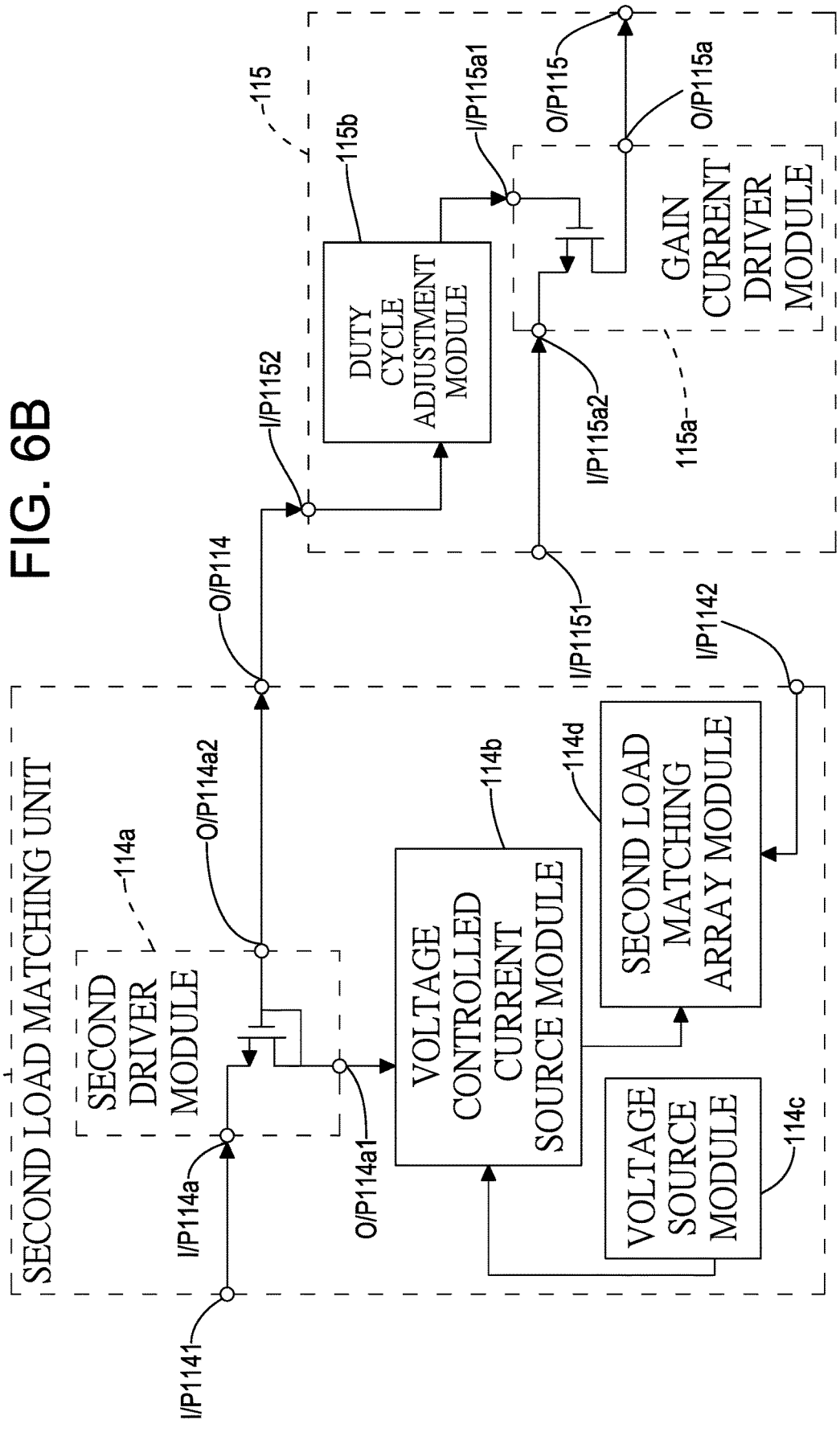
FIG. 6B is a circuit block perspective view of the second load matching unit and the constant current generation unit in the second embodiment of the constant power control device of the present invention.

With reference to FIGS. 6A and 6B, for example, the voltage controlled current source module 114*b* and the gain current driver module 115*a* are respectively two P-type transistors used for the current mirror. More particularly, the voltage controlled current source module 114*b* is adapted as a P-type transistor used on a reference current side of the current mirror for receiving the 1/N times constant current signal, and the gain current driver module 115*a* is adapted as another P-type transistor used on an output current side of the current mirror for outputting the constant current signal. A width to length ratio W/L of the P-type transistor adapted for the voltage controlled current source module 114*b* to a width to length ratio W/L of the other P-type transistor adapted for the gain current driver module 115*a* is a first ratio. In the current embodiment, the first ratio is 1/N. The constant current signal is a base voltage or a gate voltage of the two P-type transistors used for the voltage controlled current source module 114*b* and the gain current driver module 115*a*.

Overall, in order to provide stable power to a vaporizer, a constant voltage is usually conventionally provided to the vaporizer. The present invention, however, provides constant current to the load unit 221 in order to provide stable power for vaporizing the liquefied medication. The constant voltage provided by conventional arts is hard to maintain due to insufficient electric power obtained from, for example, a battery. A battery usually becomes less capable in supplying stable voltage as less battery power remains. By supplying constant current, the constant power control device 11 of the present invention uses a better design, as constant stable power can be maintained regardless of voltage changes during periods of sudden power consumptions.

Furthermore, the high level voltage and the low level voltage outputted by the first comparator module 112*b* of the first load matching unit 112 are easy to be used for controlling a digitized load array. By using the binary signal, the control signal controls and adjusts resistance values of the first load matching array module 112*c* and the second load matching array module 114*d*. As such, the circuit design of the present invention is effective, efficient, and economic for maintaining constant power output to the load unit 221

The present invention generates the constant current signal with a constant current $I_L$ through the current mirror and the voltage controlled current source module 114*b* with the voltage source module 114*c*, and thus generates constant power to the load unit 221. This way, the present invention is able to decrease total energy spent and the layout arrays used for manufacturing a semiconductor integrated circuit. Since the resistance value for the second load matching unit 114 is N times greater than the resistance value for the first load matching unit 112, the 1/N times constant current signal is used in parts of the circuit for consuming less energy. By setting constant current, the present invention is able to prevent voltage increases from raising power outputted by the present invention. Also, by maintaining constant current instead of maintaining constant voltage, the present invention is able to more effectively, efficiently, and economically control the power outputted by the present invention.

Furthermore, the present invention adjusts the duty cycle of the constant current signal through the duty cycle adjustment module 115*b*, and thus the present invention is able to adjust the power consumed by the load unit 221 with more factors available for power control.

The above discloses only a few embodiments of the present invention. The present invention is free to be elsewise in other embodiments. Any technical personnel within related field of knowledge is welcomed to make minor adjustments towards the present invention. However, everything related to the present invention will be protected by what is claimed for the present invention.

What is claimed is:

1. A constant power control device of an active vaporization suction apparatus, comprising:
a power unit, having a power port; wherein the power port outputs a power signal;
a first load matching unit, having a first power input port, a load connection port, a matching signal output port, and a first control signal input port; wherein the first power input port is electrically connected to the power port for receiving the power signal;
a matching control unit, having a matching signal input port and a control signal output port; wherein the matching signal input port is electrically connected to the matching signal output port of the first load matching unit, and the control signal output port is electrically connected to the first control signal input port of the first load matching unit;

a second load matching unit, having a second power input port, a constant current control signal output port, and a second control signal input port; wherein the second power input port is electrically connected to the power port for receiving the power signal, and the second control signal input port is electrically connected to the control signal output port of the matching control unit;

a constant current generation unit, having a third power input port, a constant current control signal input port, and a constant current output port; wherein the third power input port is electrically connected to the power port for receiving the power signal; wherein the constant current control signal input port is electrically connected to the constant current control signal output port of the second load matching unit; wherein the constant current output port is adapted to be electrically connected to a load unit of a medication box;

wherein when the load connection port of the first load matching unit is electrically connected to the load unit of the medication box, the first load matching unit generates a load matching signal, and outputs the load matching signal through the load connection port to the load unit of the medication box; wherein the matching signal output port of the first load matching unit also outputs a matching result signal to the matching control unit; the matching control unit receives the matching result signal, generates a control signal according to the matching result signal, and outputs the control signal through the control signal output port to the first load matching unit and the second load matching unit; wherein the matching control unit controls a first load value of the first load matching unit to match a load value of the load unit of the medication box, and also controls a second load value of the second load matching unit to match the load value of the load unit of the medication box;

wherein when the second load matching unit receives the control signal outputted from the matching control unit, the second load matching unit generates a constant current control signal according to the control signal and outputs the constant current control signal through the constant current control signal output port to the constant current generation unit;

wherein when the constant current generation unit receives the constant current control signal, the constant current generation unit generates a constant current signal according to the constant current control signal, and outputs the constant current signal through the constant current output port to the load unit of the medication box, and thus allows the load unit of the medication box to generate a constant power.

2. The constant power control device of the active vaporization suction apparatus as claimed in claim 1, wherein when the first load value of the first load matching unit matches the load value of the load unit, the first load matching unit stops outputting the load matching signal.

3. The constant power control device of the active vaporization suction apparatus as claimed in claim 1, wherein the first load matching unit comprises:

a first driver module, having a first driver power input port, a first matching current output port, and a second matching current output port; wherein the first driver power input port is the first power input port, and the first matching current output port is the load connection port; wherein the first driver power input port receives the power signal, generates a first matching current and a second matching current according to the power signal, and outputs the first matching current from the first matching current output port and the second matching current from the second matching current output port; wherein the first current value of the first matching current equals a second current value of the second matching current;

a first comparator module, having a first comparator positive input side, a first comparator negative input side, and a first comparator output side; wherein the first comparator positive input side is electrically connected to the first matching current output port, and the first comparator negative input side is electrically connected to the second matching current output port; wherein the first comparator output side is the matching signal output port;

a first load matching array module, having a comparator current input port and a first matching control signal input port; wherein the comparator current input port is electrically connected to the second matching current output port; wherein the first matching control signal input port is the first control signal input port.

4. The constant power control device of the active vaporization suction apparatus as claimed in claim 3, wherein when a voltage of the first comparator output side of the first comparator module changes from a low level voltage to a high level voltage or changes from the high level voltage to the low level voltage, the first load value of the first load matching unit matches the load value of the load unit.

5. The constant power control device of the active vaporization suction apparatus as claimed in claim 3, wherein the first load matching array module of the first load matching unit further comprises:

multiple first load matching resistors; wherein the first load matching resistors are connected in series, and each of the first load matching resistors has a different resistance value;

multiple first switches, respectively one-to-one connected in parallel with the first load matching resistors; wherein the first switches each respectively have a control side, and the control sides of the first switches are the first matching control signal input port for receiving the control signal; wherein the first switches are respectively controlled for switching on and off according to the control signal;

wherein when one or more of the first switches are switched on for conducting electricity, the first load matching resistors connected in parallel with the first switches that are switched on and conducting electricity are shorted by the first switches that are switched on and conducting electricity.

6. The constant power control device of the active vaporization suction apparatus as claimed in claim 1, wherein the second load matching unit comprises:

a second driver module, having a second driver power input port, a driver power output port, and a gain control signal output port; wherein the second driver power input port is the second power input port for receiving the power signal; wherein the second driver module generates a driver power according to the power signal, and outputs the driver power through the driver power output port; wherein the gain control signal output port is the constant current control signal output port;

a voltage controlled current source module, having a driver power input port, a voltage control signal input port, and a voltage controlled current output port; wherein the driver power input port is electrically connected to the driver power output port of the second driver module for receiving the driver power;

a voltage source module, having a voltage control signal output port; wherein the voltage control signal output port is electrically connected to the voltage control signal input port of the voltage controlled current source module; wherein the voltage source module outputs a constant voltage signal through the voltage control signal output port to the voltage control signal input port;

a second load matching array module, having a voltage controlled current input port and a second matching control signal input port; wherein the voltage controlled current input port is electrically connected to the voltage controlled current output port, and the second matching control signal input port is electrically connected to the second control signal input port;

wherein the voltage controlled current source module controls a current value of the driver power according to the constant voltage signal and a load value of the second load matching array module;

wherein the second driver module generates the constant current control signal according to the current value of the driver power.

7. The constant power control device of the active vaporization suction apparatus as claimed in claim 6, wherein the voltage controlled current source module comprises:

a second comparator module, having a second comparator positive input side, a second comparator negative input side, and a second comparator output side; wherein the second comparator positive input side is the voltage control signal input port for receiving the constant voltage signal; wherein the second comparator negative input side is the voltage controlled current output port;

a Metal-Oxide-Semiconductor Field-Effect Transistor (MOSFET), having a drain, a source, and a gate; wherein the gate is electrically connected to the second comparator output side of the second comparator module; wherein one of the drain and the source is electrically connected to the second comparator negative input side of the second comparator module, and the other one of the drain and the source is the driver power input port.

8. The constant power control device of the active vaporization suction apparatus as claimed in claim 6, wherein the voltage controlled current source module comprises:

a second comparator module, having a second comparator positive input side, a second comparator negative input side, and a second comparator output side; wherein the second comparator positive input side is the voltage control signal input port for receiving the constant voltage signal; wherein the second comparator negative input side is the voltage controlled current output port;

a bipolar transistor (BJT), having a collector, an emitter, and a base; wherein the base is electrically connected to the second comparator output side of the second comparator module; wherein one of the collector and the emitter is electrically connected to the second comparator negative input side of the second comparator module, and the other one of the collector and the emitter is the driver power input port.

9. The constant power control device of the active vaporization suction apparatus as claimed in claim 6, wherein the second load matching array module of the second load matching unit comprises:

multiple second load matching resistors; wherein the second load matching resistors are connected in series, and each of the second load matching resistors has a different resistance value;

multiple second switches, respectively one-to-one connected in parallel with the second load matching resistors; wherein the second switches each respectively have a control side, and the control sides of the second switches are the second matching control signal input port for receiving the control signal; wherein the second switches are respectively controlled for switching on and off according to the control signal;

wherein when one or more of the second switches are switched on for conducting electricity, the second load matching resistors connected in parallel with the second switches that are switched on and conducting electricity are shorted by the second switches that are switched on and conducting electricity.

10. The constant power control device of the active vaporization suction apparatus as claimed in claim 6, wherein the constant current generation unit comprises:

a gain current driver module, having a third driver power input port, a gain control signal input port, and a gain current output port; wherein the third driver power input port is the third power input port for receiving the power signal; wherein the gain control signal input port is the constant current control signal input port for receiving the constant current control signal; wherein the gain current driver module generates a gain current according to the constant current control signal and outputs the gain current through the gain current output port;

a duty cycle adjustment module, having an adjustment input port and an adjustment output port; wherein the adjustment input port is electrically connected to the gain current output port for receiving the gain current; wherein the adjustment output port is the constant current output port; wherein the duty cycle adjustment module adjusts a duty cycle of the gain current for generating the constant current signal and outputs the constant current signal through the adjustment output port.

11. The constant power control device of the active vaporization suction apparatus as claimed in claim 6, wherein the constant current generation unit comprises:

a gain current driver module, having a third driver power input port, a gain control signal input port, and a gain current output port; wherein the third driver power input port is the third power input port for receiving the power signal; wherein the gain control signal input port is the constant current control signal input port for receiving the constant current control signal; wherein the gain current driver module generates a gain current according to the constant current control signal and outputs the gain current through the gain current output port;

a duty cycle adjustment module, having an adjustment input port and an adjustment output port; wherein the adjustment input port is the constant current control signal input port for receiving the constant current control signal; wherein the adjustment output port is electrically connected to the gain control signal input port of the gain current driver module; wherein the duty cycle adjustment module adjusts a duty cycle of the constant current control signal, and thus the duty cycle adjustment module is able to adjust an electric current duty cycle of the constant current signal through the gain current driver module.

* * * * *